US012424596B2

(12) United States Patent
Tsai et al.

(10) Patent No.: US 12,424,596 B2
(45) Date of Patent: Sep. 23, 2025

(54) OPTOELECTRONIC PACKAGE STRUCTURE AND METHOD OF MANUFACTURING THE SAME

(71) Applicant: Advanced Semiconductor Engineering, Inc., Kaohsiung (TW)

(72) Inventors: Hsiang-Cheng Tsai, Kaohsiung (TW); Jui-Che Wu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 958 days.

(21) Appl. No.: 17/513,748

(22) Filed: Oct. 28, 2021

(65) Prior Publication Data

US 2023/0136046 A1 May 4, 2023

(51) Int. Cl.

*H01L 27/146* (2006.01)
*H01L 23/13* (2006.01)
*H01L 25/16* (2023.01)

(52) U.S. Cl.

CPC ............ *H01L 25/167* (2013.01); *H01L 23/13* (2013.01)

(58) Field of Classification Search

CPC .............................. H01L 25/167; H01L 23/13
See application file for complete search history.

(56) References Cited

U.S. PATENT DOCUMENTS

2002/0089913 A1* 7/2002 Moriyama .............. H01S 5/023
2004/0202477 A1* 10/2004 Nagasaka ............ G02B 6/4214 398/138
2013/0273672 A1* 10/2013 Heck ..................... H10F 77/407 356/400

OTHER PUBLICATIONS

U.S. Appl. No. 17/185,499, filed Feb. 25, 2021, Lin et al.

* cited by examiner

*Primary Examiner* — Ismail A Muse
(74) *Attorney, Agent, or Firm* — FOLEY & LARDNER LLP

(57) ABSTRACT

An optoelectronic package structure is provided. The optoelectronic package structure includes a carrier and a photonic component. The carrier includes an upper surface and a first lateral surface. The photonic component is disposed over an upper surface of the carrier and includes an optical portion. The carrier includes a recessed portion recessed from the first lateral surface of the carrier, and the optical portion of the photonic component is located within the recessed portion of the carrier from a top view perspective.

13 Claims, 16 Drawing Sheets

OPTOELECTRONIC PACKAGE STRUCTURE AND METHOD OF MANUFACTURING THE SAME

BACKGROUND

1. Field of the Disclosure

The present disclosure relates generally to an optoelectronic package structure and a method of manufacturing the optoelectronic package structure.

2. Description of the Related Art

An optoelectronic package structure include an electronic integrated circuit (EIC) and a photonic integrated circuit (PIC) and are applicable for optical communication. The optical portion of the PIC includes at least one optical ports for coupling to an external optical component, such as an optical fiber or optical fiber array unit. However, the optical portion of the photonic component may be easily damaged or contaminated during manufacturing processes of the optoelectronic package structure.

SUMMARY

In some embodiments, an optoelectronic package structure includes a carrier and a photonic component. The carrier includes an upper surface and a first lateral surface. The photonic component is disposed over the upper surface of the carrier and includes an optical portion. The carrier includes a recessed portion recessed from the first lateral surface of the carrier, and the optical portion of the photonic component is located within the recessed portion of the carrier from a top view perspective.

In some embodiments, an optoelectronic package structure includes a supportive structure and a photonic component. The photonic component is disposed on the supportive structure. The photonic component includes an optical portion. The optical portion of the photonic component overhangs an edge of the supportive structure. The supportive structure has an extension portion extending outwardly with respect to the edge of the supportive structure, and a length of the extension portion is greater than an overhang distance of the optical portion.

In some embodiments, an optoelectronic package structure includes a supportive structure and a photonic component. The photonic component is disposed on the supportive structure. The photonic component includes an optical portion extending beyond a first edge of the supportive structure. The supportive structure defines a shaped region adjacent to the first edge of the supportive structure. The shaped region is configured to protect the optical portion of the photonic component when turning the optoelectronic package structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
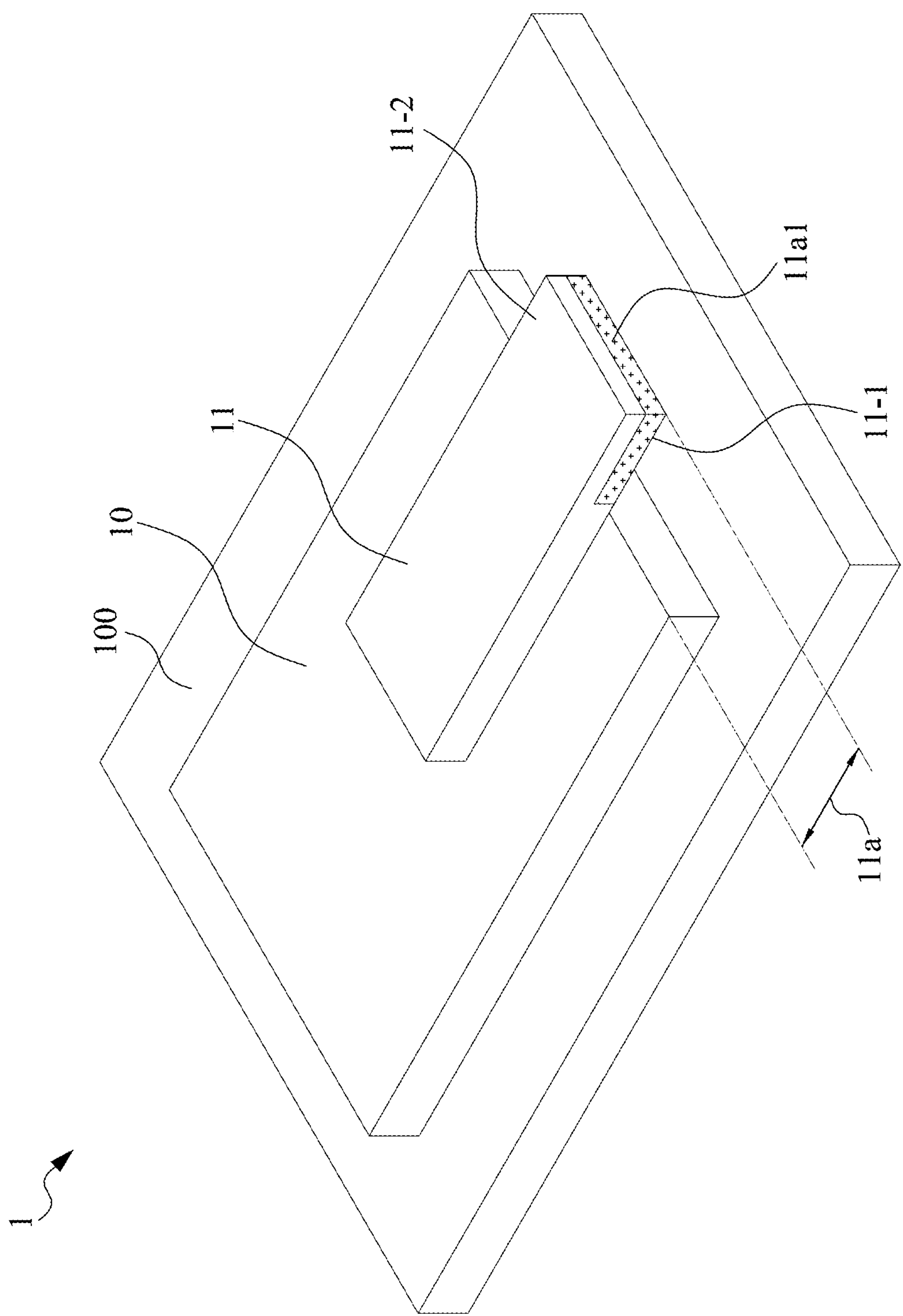
FIG. 1A illustrates a three-dimensional diagram of an optoelectronic package structure in accordance with some comparative embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the "active side" or "active surface" of a photonic component may refer to a side or a surface along which a waveguide is disposed. The waveguide may be disposed adjacent to the active side or the active surface. The "inactive side" or "inactive surface" of a photonic component may refer to a side or a surface along which no waveguide is disposed.

As used herein, the term "active side" or "active surface" of an electronic component may refer to a side or a surface of an electronic component on which electrical or contact terminals such as contact pads, conductive studs or conductive pillars are disposed, for transmission of electrical signals or power. The "inactive side" or "inactive surface" of an electronic component may refer to a surface of the electronic component on which no contact terminals are disposed.

Figure 1B:
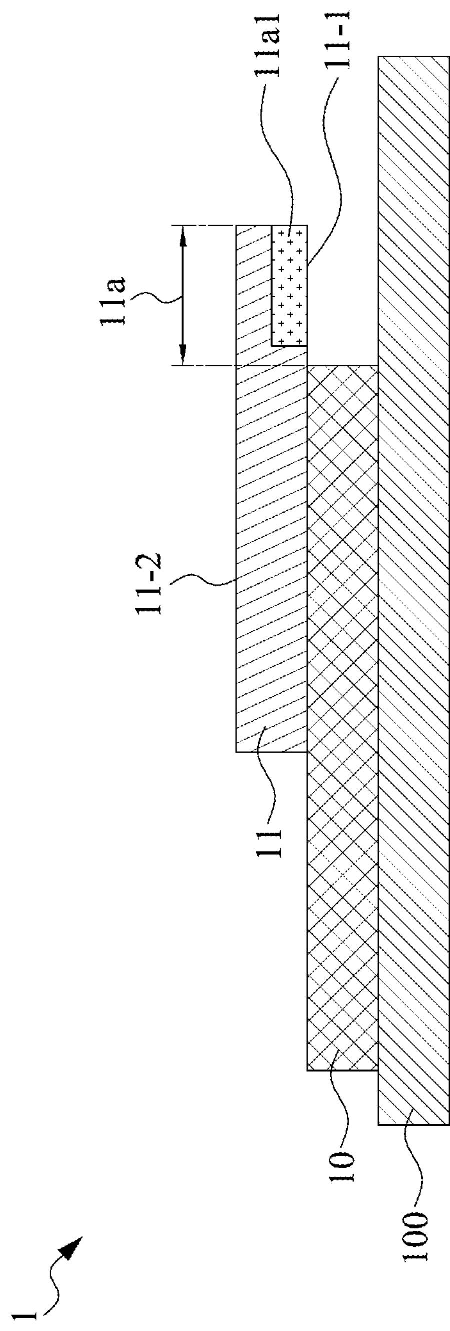
FIG. 1B illustrates a cross-sectional view of the optoelectronic package structure of FIG. 1A at a fabrication stage.
Figure 1C:
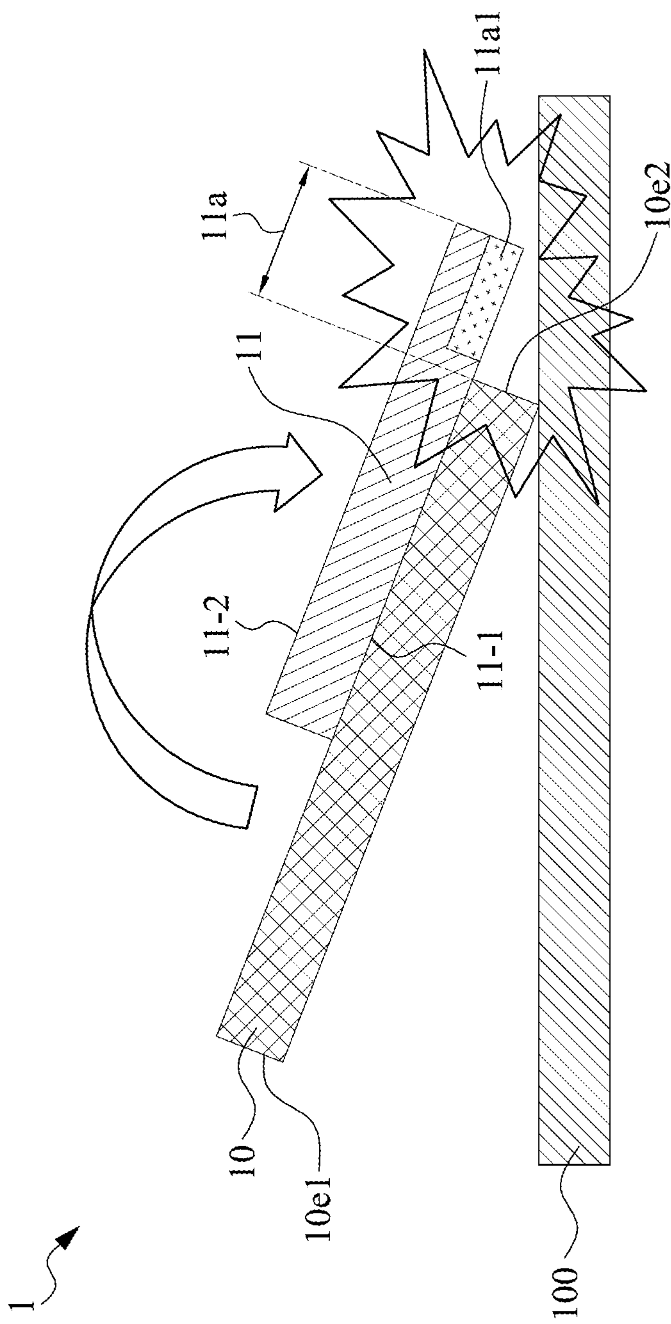
FIG. 1C illustrates a cross-sectional view of the optoelectronic package structure of FIG. 1A at another fabrication stage.

FIG. 1A illustrates a three-dimensional diagram of an optoelectronic package structure 1 in accordance with some comparative embodiments of the present disclosure. FIG. 1B and FIG. 1C illustrate cross-sectional views of the optoelectronic package structure 1 at different fabrication stages.

Referring to FIGS. 1A and 1, the optoelectronic package structure 1 includes a carrier 10 and a photonic component 11. The photonic component 11 includes an active surface (or side) 11-1 and an inactive surface (or side) 11-2. In some embodiments, the active surface of the photonic component 11 may include input/output (I/O) terminals. The photonic component 11 is disposed on the carrier 10, with its active surface (or side) 11-1 facing the carrier 10. The photonic component 11 includes a portion 11*a* overhangs the carrier 10. The photonic component 11 includes an optical portion 11*a*1 adjacent to the active side 11-1 of the photonic component 11. In some embodiments, the optical portion 11*a*1 is located at the portion 11*a* and includes one or more optical ports (not shown) exposed from a lower surface of the portion 11*a*. In some embodiments, the one or more optical ports are configured to be coupled to an optical component, such as one or more optical fibers or one or more optical fiber array units (FAU).

In general, a tape 100 as shown in FIGS. 1A and 1B may be used to during the manufacturing process of the optoelectronic package structure 1. As shown in FIG. 1C, in order to separate the optoelectronic package structure 1 from the tape 100, an edge 10*e*1 of the carrier 10 is lifted and the optoelectronic package structure 1 is pivoted at an edge 10*e*2 of the carrier 11. In some embodiments, the separation of the optoelectronic package structure 1 from the tape 100 is carried out so that a ball mount process can be performed subsequently on the bottom surface of the carrier 10 facing away from the photonic component 11. However, since the portion 11*a* extends laterally outward the edge 10*e*2 of the carrier 11, the optical portion 11*a*1 of the portion 11*a* is liable to collide with the tape 110 during the separation process. As a result, the optical ports of the optical portion Hal may be damaged which affects the yield of the optoelectronic package structure 1.

Figure 2A:
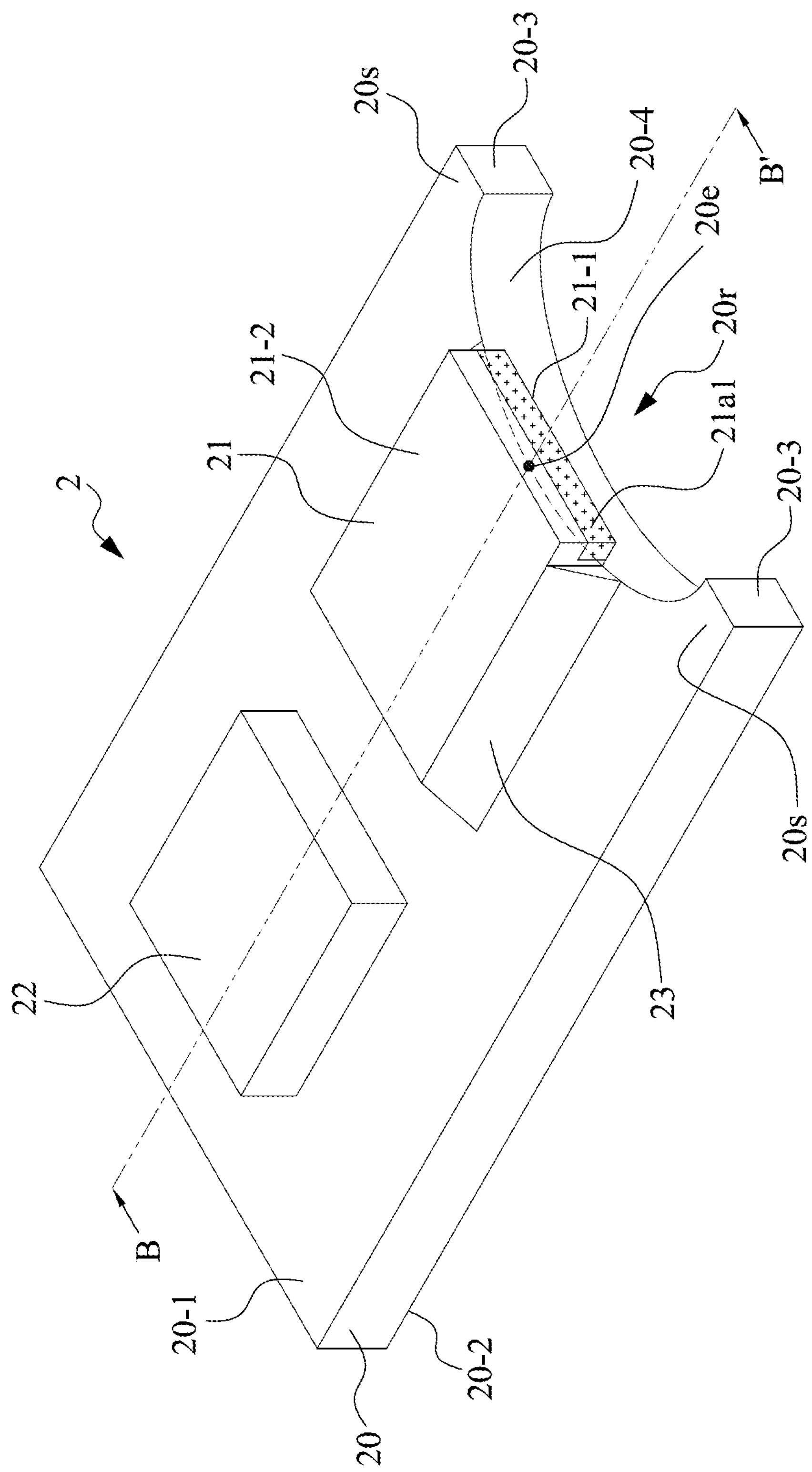
FIG. 2A illustrates a three-dimensional diagram of an optoelectronic package structure in accordance with some embodiments of the present disclosure.
Figure 2B:
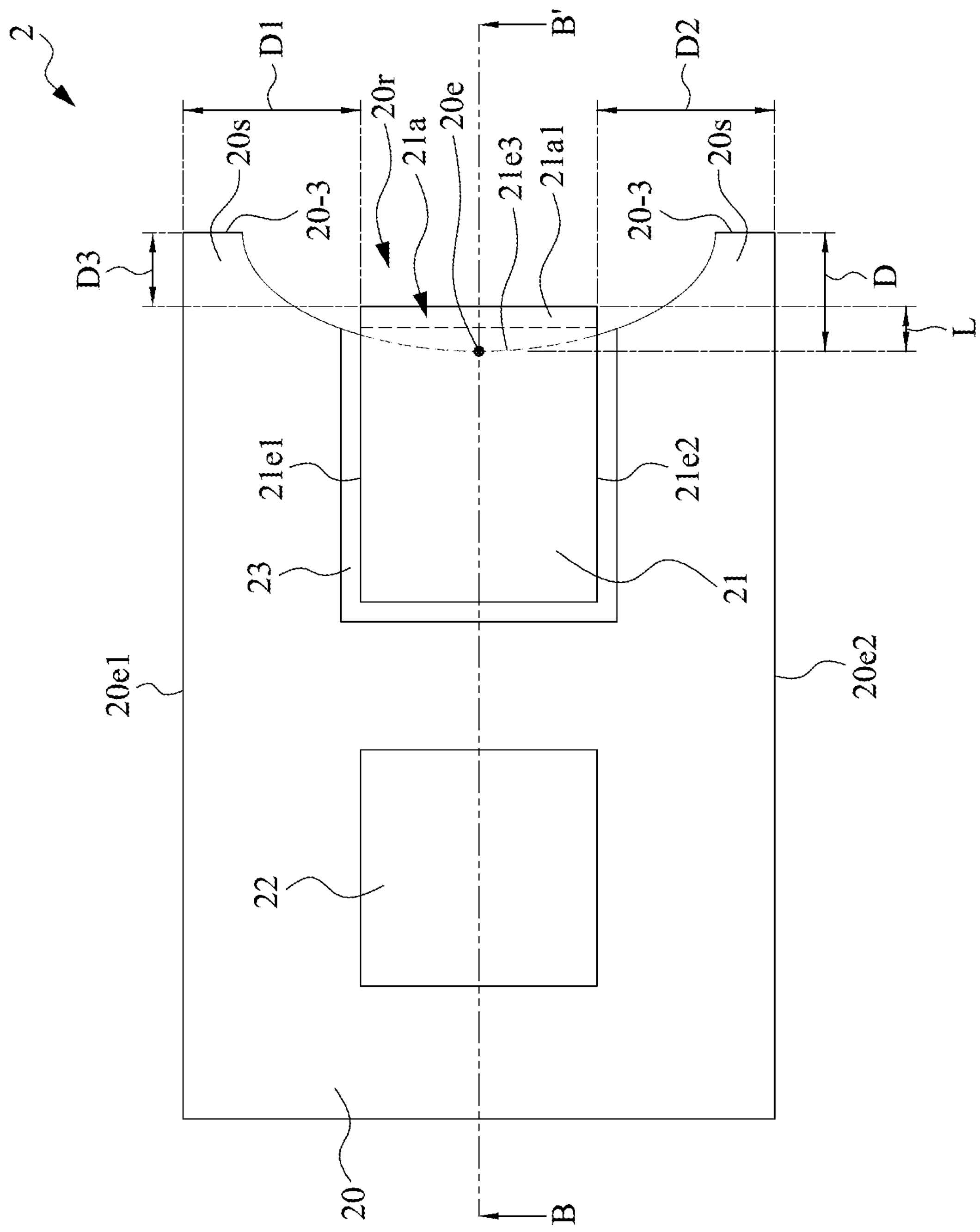
FIG. 2B illustrates a top view of an optoelectronic package structure in accordance with some embodiments of the present disclosure.
Figure 2C:
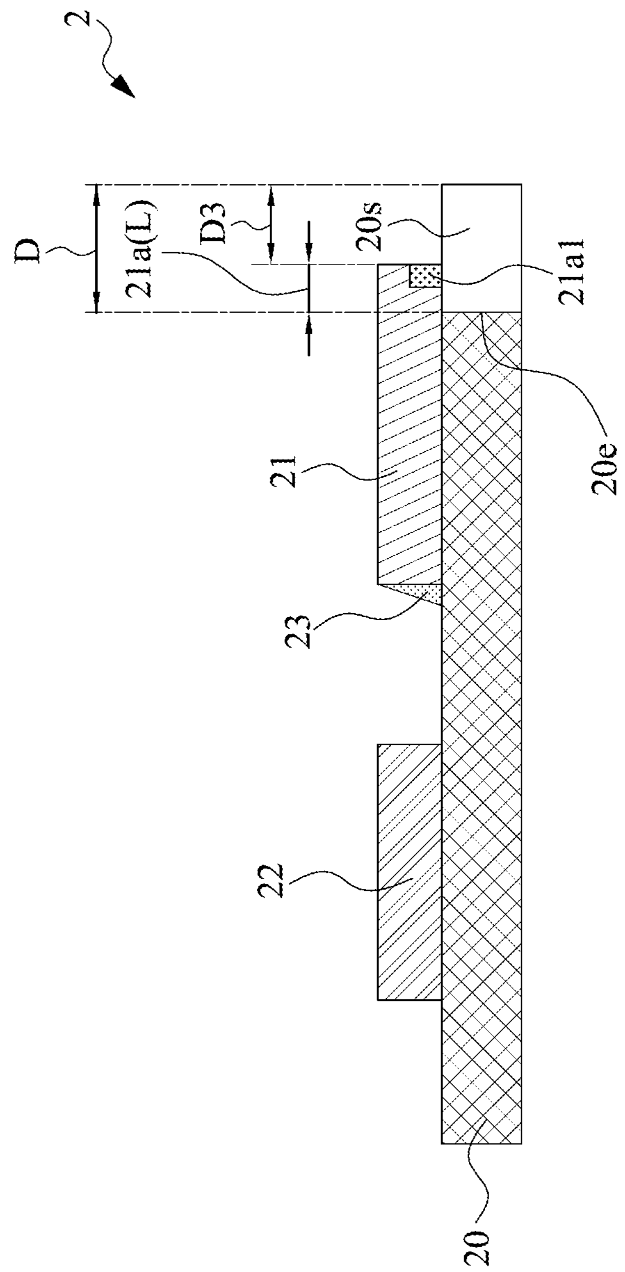
FIG. 2C illustrates a cross-sectional view of an optoelectronic package structure in accordance with some embodiments of the present disclosure.

FIG. 2A illustrates a three-dimensional diagram of an optoelectronic package structure 2 in accordance with some embodiments of the present disclosure. FIG. 2B illustrates a top view of an optoelectronic package structure 2 in accordance with some embodiments of the present disclosure. FIG. 2C illustrates a cross-sectional view of an optoelectronic package structure 2 along line B-B' of FIG. 2B in accordance with some embodiments of the present disclosure. For simplification purpose, some elements may not be shown in these drawings.

Referring to FIGS. 2A and 2B, the optoelectronic package structure 2 includes a carrier 20 and a photonic component 21. The carrier 20 includes an upper surface 20-1, a lower surface 20-2, a lateral surface 20-3 and a lateral surface 20-4. In some embodiments, the carrier 20 may include an electrically conductive structure and a dielectric structure (not shown). The electrically conductive structure may include electrically conductive features, such as one or more conductive wiring layers, contact pads (disposed at the upper surface 20-1 and/or the lower surface 20-2 of the carrier 20), vias electrically connecting the conductive wiring layers and pads, and so on. In some embodiments, the dielectric structure may include one or more dielectric layers. The one or more dielectric layers and the one or more conductive wiring layers are stacked on one another. The carrier 20 may be or include a paper-based copper foil laminate, a composite copper foil laminate, a polymer-impregnated glass-fiber-based copper foil laminate, or so on. The carrier 20 may be or include a substrate such as an organic substrate or a leadframe. The carrier 20 may be or include an interposer, an RDL, a fan-out substrate, or the like.

As shown in FIG. 2A, the photonic component 21 includes a lower surface 21-1 and an upper surface 21-2. In some embodiments, the lower surface 21-1 is an active surface and the upper surface is an inactive surface. The photonic component 21 is disposed over the upper surface 20-1 of the carrier 20 with its active surface 21-1 facing the upper surface 20-1 of carrier 20.

As shown in FIG. 2A, the carrier 20 includes a recessed portion 20*r* recessed from the lateral surface 20-3 of the carrier 20. The recessed portion 20*r* is defined by the lateral surface 20-4 of the carrier 20. In some embodiments, the lateral surface 20-4 is a curved surface. As shown in FIGS. 2B and 2C, the photonic component 21 includes a portion 21*a* of the photonic component 21 overhangs the carrier 20 at the recessed portion 20*r*. The portion 21*a* of the photonic component 21 overhangs the lateral surface 20-4 of the carrier 20. The portion 21*a* of the photonic component 21 may be referred to as "overhang portion" hereinafter. As shown in FIGS. 2A to 2C, the photonic component 21 includes an optical portion 21*a*1 adjacent to the lower surface 21-1 of the photonic component 21. The optical portion 21*a*1 is located at the overhang portion 21*a* of the photonic component 21, so that the optical portion 21*a*1 overhangs the carrier 20 at the recessed portion 20*r*. In some embodiments, the optical portion 21*a*1 overhangs the carrier 20 such that an optical component, such as an optical fiber or optical fiber array unit (FAU) (not shown), can be disposed on and/or coupled to the optical portion 21*a*1 of the photonic component 21. In some embodiments, the optical portion 21*a*1 includes one or more optical ports (not shown). In some embodiments, the one or more optical ports are configured to be coupled to the optical component. As shown in FIGS. 2A and 2B, the optical portion 21*a*1 of the photonic component 21 is located within the recessed portion 20*r* of the carrier 20 from a top view perspective. As shown in FIGS. 2A and 2B, the recessed portion 20*r* is larger than the optical portion 21*a*1 from a top view perspective. Specifically, a projection of the recessed portion 20*r* is greater than a projection of the optical portion 21*a*1 in a vertical direction.

As shown in FIG. 2B, the photonic component 21 includes a first edge 21*el*, a second edge 21*e*2 opposite to the first edge 21*e*1 and a third edge 21*e*3 connecting the first edge 21*e*1 and the second edge 21*e*2 from a top view perspective. As shown in FIG. 2B, the optical portion 21*a*1 of the photonic component 21 is adjacent to the third edge 21*e*3 of the photonic component 21. In some embodiments, a distance D1 between the first edge 21*e*1 of the photonic component 21 to an edge 20*e*1 of the carrier 20 adjacent to the first edge 21*e*1 of the photonic component 21 is the same as a distance D2 between the second edge 21*e*2 of the photonic component 21 to an edge 20*e*2 of the carrier 20 adjacent to the second edge 21*e*2 of the photonic component 21, from a top view perspective. In some embodiments, a distance D1 between the first edge 21*e*1 of the photonic component 21 to an edge 20*e*1 of the carrier 20 adjacent to the first edge 21*e*1 of the photonic component 21 is different from a distance D2 between the second edge 21*e*2 of the photonic component 21 to an edge 20*e*2 of the carrier 20 adjacent to the second edge 21*e*2 of the photonic component 21, from a top view perspective.

As shown in FIGS. 2B and 2C, the optical portion 21*a*1 of the photonic component 21 is spaced apart from the lateral surface 20-3 of the carrier 20 by a predetermined distance D3 from a top view perspective. In some embodiments, the predetermined distance D3 is in a range from about 100 μm to about 500 μm. In some embodiments, the predetermined distance D3 may be, for example, 100 μm, 150 μm, 200 μm, 250 μm, 300 μm, 350 μm, 400 μm, 450 μm or 500 μm.

In some embodiments, the predetermined distance D3 may be associated with the following parameters A, B, C, X, and Y. A stands for die size tolerance, which in this case refers to the tolerance of the length of the photonic component 21 along a direction parallel to the edge 20*e*1 of the carrier 20, and which may be in a range of about ±5 μm to about ±15 μm. B stands for die bond shift, which in this case refers to the lateral or longitudinal position shift of the photonic component 21 with respect to a predetermined position when being bonded to the carrier 20, and which may be in a range of about ±7 μm to about ±50 μm. C stands for die bond rotate on a reference plane (such as the upper surface 20-1 of the carrier 20), which in this case refers to the length of the photonic component 21 multiplied by sin θ, wherein θ is the angle between the edge 20*e*1 of the carrier 20 and the edge 21*e*1 of the photonic component 21, and may be in a range of about ±1 degree to about ±5 degrees. X stands for package saw shift, which in this case refers to the lateral or longitudinal position shift of the sawing performed on the carrier 20 with respect to a predetermined position, and which may be in a range of about ±10 μm to about ±50 μm. Y stands for slot size tolerance, which in this case refers to the lateral or longitudinal tolerance of the size of the recessed portion 20*r*, and which may be a range of about ±10 μm to about ±50 μm.

As shown in FIGS. 2A to 2C, the optoelectronic package structure 2 may further include one or more electronic components 22 disposed over the upper surface 20-1 of the carrier 20 with an active side of the electronic component(s) 22 facing the upper surface 20-1 of the carrier 20. In some embodiments, the electronic component(s) 22 may be or include a modulator driver (DRV), a trans-impedance amplifier (TIA), and/or so on. In some embodiments, the active surface of the electronic components 22 may include input/output (I/O) terminals and may be electrically connected to the carrier 20. In some embodiments, the electronic components 22 may be disposed adjacent to the photonic component 21 along an axis parallel to the upper surface 20-1 of the carrier 20 (i.e., the electronic components 22 and the photonic component 21 are disposed side-by-side in a horizontal direction). In some other embodiments, the electronic component 22 may be disposed between the carrier 20 and the photonic component 21, as described in detail with respect to FIGS. 7A, 7B, 8A, 8B and 9 below.

As shown in FIGS. 2A, 2B and 2C, the optoelectronic package structure 2 may further include a blocking structure 23. The blocking structure 23 is disposed over the upper surface 20-1 of the carrier 20. In some embodiments, the blocking structure 23 is disposed between the photonic component 21 and the one or more electronic component(s) 22. In some embodiments, the blocking structure 23 may be disposed adjacent to a side or edge (e.g., 21*e*3) of the photonic component 21 which faces the electronic component 22. In some embodiments, the blocking structure 23 surrounds each sides or edges (i.e., 21*e*1, 21*e*2 and 21*e*3) of the photonic component 21 which are located on the carrier 20. In some embodiments, the blocking structure 23 is made of a polymeric material. In some embodiments, the electronic component 22 is spaced apart from the photonic component 21 via a blocking structure 23.

Although not shown in FIGS. 2A, 2B and 2C, during the manufacturing process, an underfill material may be disposed or filled in the gap between the carrier 20 and the electronic component 22 so as to surround the electrical connection structures (such as solder bumps) disposed therebetween. As the underfill material may have high fluidity and may easily flow due to capillary phenomenon, the underfill material may overflow and reach the optical portion 21*a*1 of the photonic component 21, which may cause the optical portion 21*a*1 photonic component 21 to be contaminated or damaged. The blocking structure 23 can block the underfill material and prevent the underfill material from reaching the optical portion 21*a*1 of photonic component 21, so as to prevent the optical portion 21*a*1 from being contaminated or damaged.

Figure 2D:
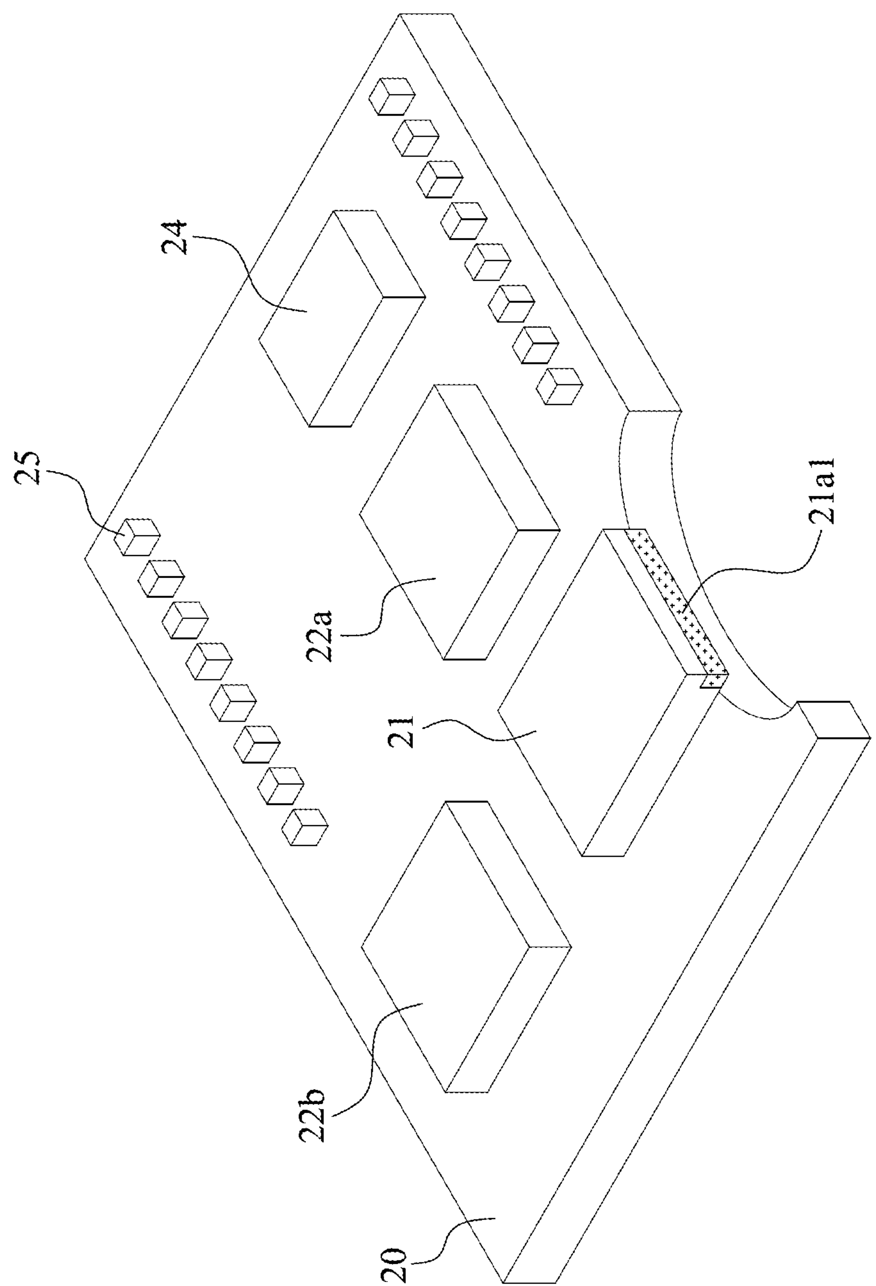
FIG. 2D illustrates a three-dimensional diagram of an optoelectronic package structure in accordance with some embodiments of the present disclosure.

FIG. 2D illustrates a three-dimensional diagram of an optoelectronic package structure 2 in accordance with some embodiments of the present disclosure. As shown in FIG. 2D, the optoelectronic package structure 2 includes a photonic component 21, electronic components 22*a* and 22*b* (such as a modulator driver and a trans-impedance amplifier), a processing unit 24 and passive components 25 disposed over an upper surface of the carrier 20. The photonic component 21, electronic components 22*a* and 22*b*, a processing unit 24 and passive components 25 may be electrically connected to the carrier 20. In some embodiment, the photonic component 21 may be electrically connected to the electronic components 22*a* and 22*b* via the carrier 20. In some embodiment, the processing unit 24 may be electrically connected to the electronic components 22*a* and 22*b* via the carrier 20. Although not shown in FIG. 2D, the optoelectronic package structure 2 may include a blocking structure as discussed above to prevent the optical portion of the photonic component 21 from being contaminated or damaged.

Figure 3:
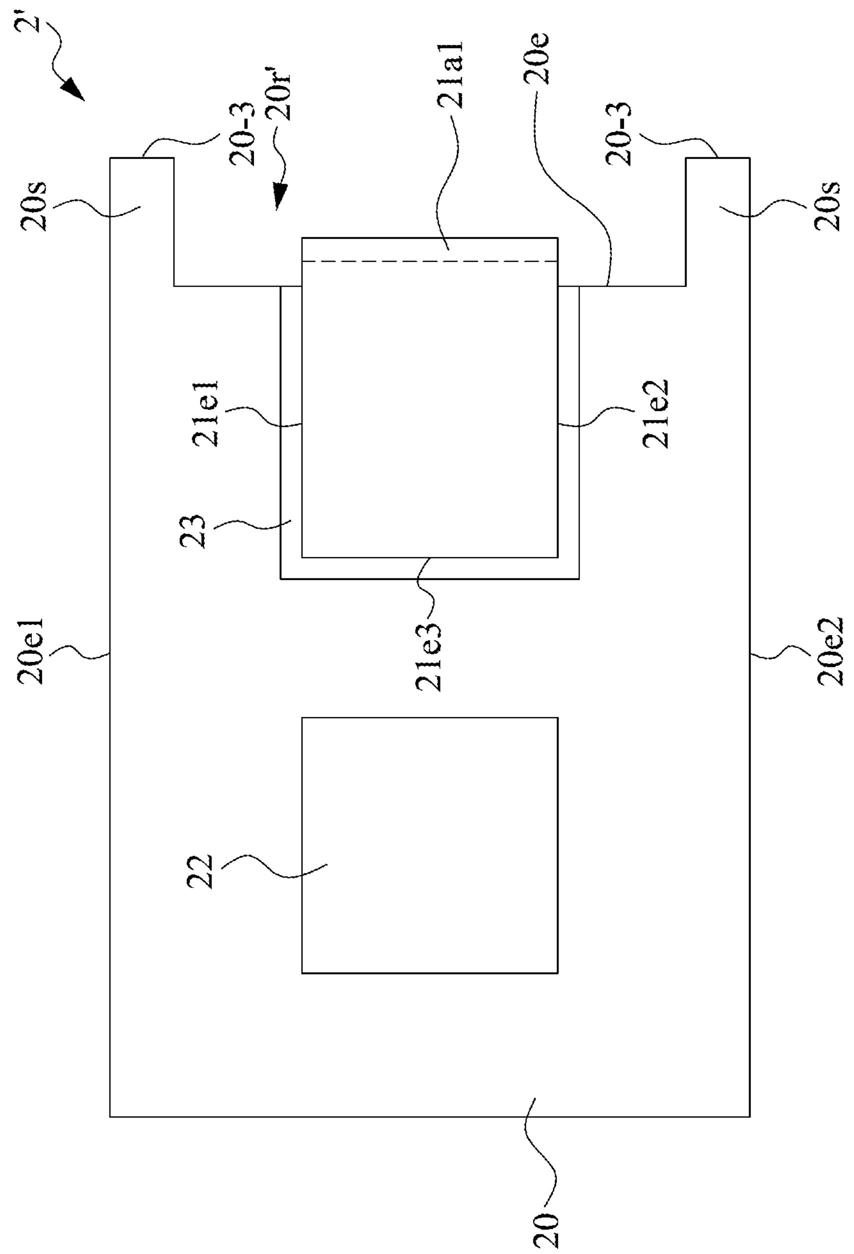
FIG. 3, FIG. 4 and FIG. 5 illustrates top views of optoelectronic package structures in accordance with some embodiments of the present disclosure.

FIG. 3 illustrates a top view of an optoelectronic package structure 2' in accordance with some embodiments of the present disclosure. The optoelectronic package structure 2' is similar to optoelectronic package structure 2, except that the recessed portion 20*r*' is defined by three planar surfaces, and is in a rectangular shape from a top view perspective.

Figure 4:
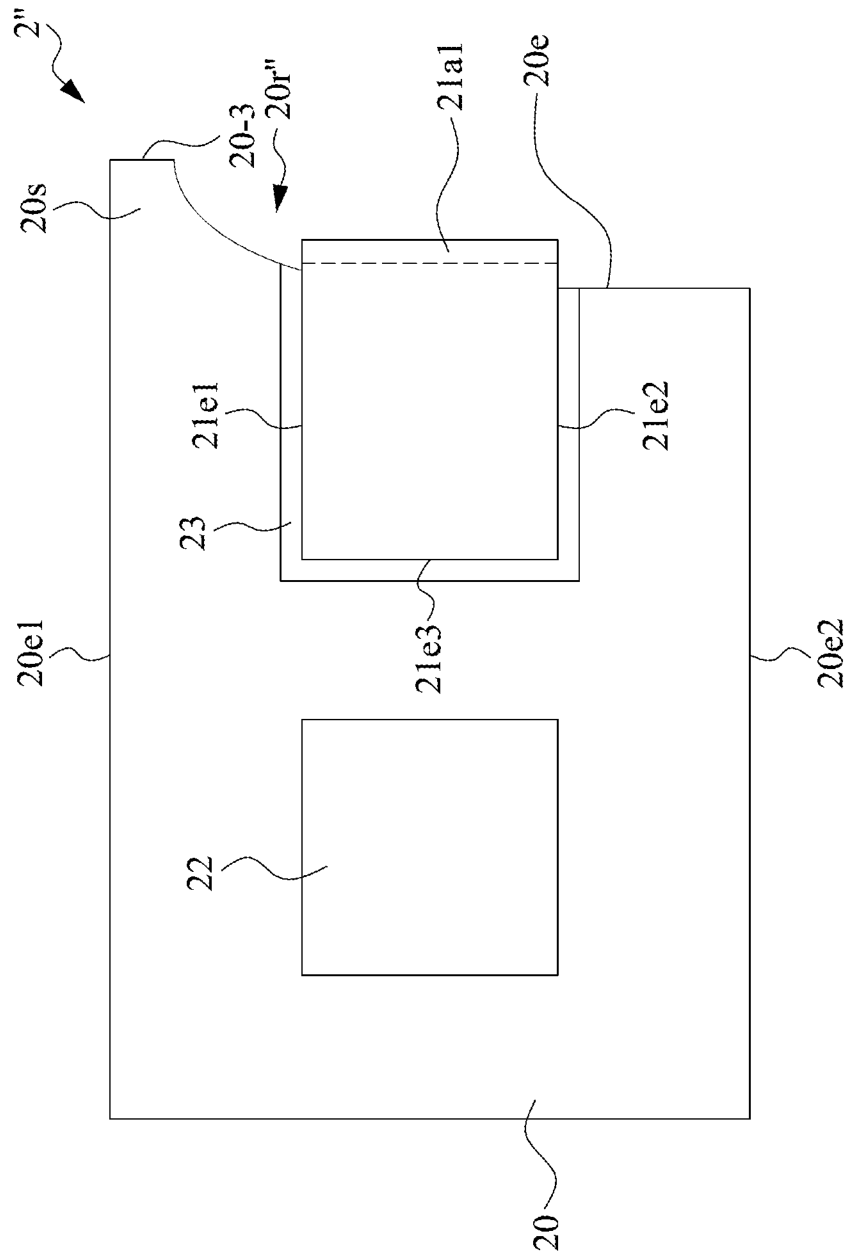

FIG. 4 illustrates a top view of an optoelectronic package structure 2" in accordance with some embodiments of the present disclosure. The optoelectronic package structure 2" is similar to optoelectronic package structure 2, except that the recessed portion 20*r*" is also recessed from a corner of the carrier 20 and is in a shape of quarter-oval from a top view perspective.

Figure 5:
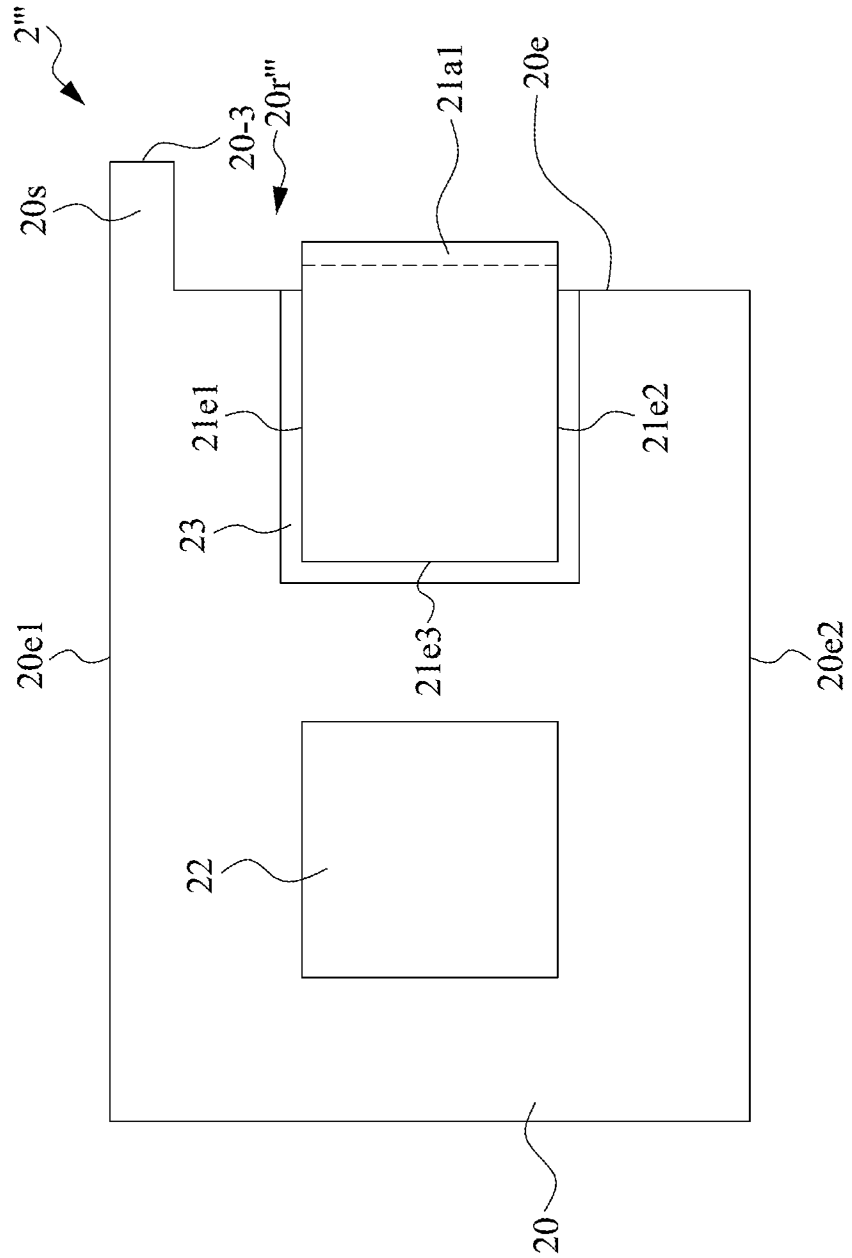

FIG. 5 illustrates a top view of an optoelectronic package structure 2"' in accordance with some embodiments of the present disclosure. The optoelectronic package structure 2"' is similar to optoelectronic package structure 2, except that the recessed portion 20*r*' is defined by two planar surfaces and is in a rectangular shape from a top view perspective, and except that the recessed portion 20*r*''' is also recessed from a corner of the carrier 20.

Figure 6:
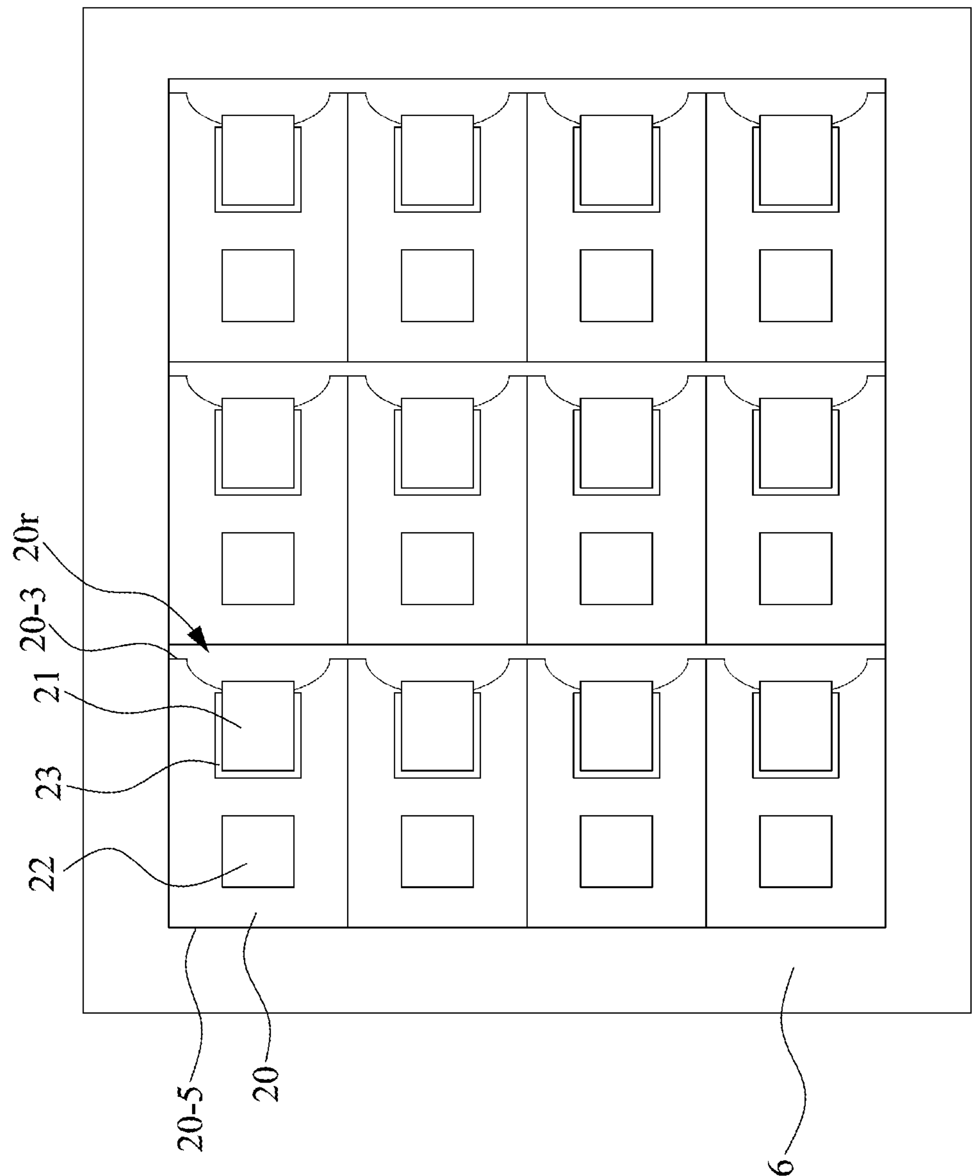
FIG. 6 illustrates a top view of an array of an optoelectronic package structure in accordance with some embodiments of the present disclosure.

FIG. 6 illustrates a top view of an array of the optoelectronic package structures 2 in accordance with some embodiments of the present disclosure. To form the array of the optoelectronic package structures 2, a bulk carrier 6 can be provided. The bulk carrier 6 may be in a form of a stripe and include a plurality of carrier units 20 (i.e., carrier 20 shown in FIG. 2A). The recessed portions 20*r* are formed in each of the carrier units 20. The photonic components 21, the electronic components 22, and the blocking structures 23 are then disposed on the carrier units 20 and arranged in a manner as described above, for example, in the embodiments with respect to FIGS. 2A, 2B, 2C, and 3-5. As a result, the array of the optoelectronic package structures 2 is obtained and the optical portion of each photonic component is exposed from the recessed portion of a respective one of the carrier units. Then, the edge 20-5 of the carrier unit 20 is lifted up so the optoelectronic package structure 2 can be turned or flipped over with the use of the edge 20-3 as a pivot. Consequently, each optoelectronic package structure 2 can be obtained through such a singulation process with no or less damage to the optical portion of the photonic component.

In the existing techniques, since the carrier units of the bulk carrier do not include a recessed portion to expose the optical portion of a photonic component, a singulation process needs to be performed on a bulk carrier so that the photonic component can be disposed on the carrier unit with an optical portion overhanging the carrier unit. However, since the singulation process is performed before the photonic components being disposed on the carrier units, the disposal of photonic components needs to be carried out manually, which not only increases the complexity of the manufacture process but also decreases the units per hour (UPH) of the manufacture process. In addition, the carrier unit needs to be attached on a tape to dispose a photonic component and/or other components on the carrier unit to prepare the optoelectronic package structure. However, as discussed above with respect to FIGS. 1A, 1B and 1C, the overhanging optical portion of the photonic component is liable to be damaged when separating the optoelectronic package structure from the tape. According to some embodiments of the present disclosure, as shown in FIG. 6 for example, since the recessed portions 20*r* are formed on the carrier units 20 of the bulk carrier 6 before disposing the photonic components 21, the photonic components 21 can be disposed on each of the carrier units 20 automatically by machine and then the resulting optoelectronic package structures can be singulated with no or less damage to the optical portion of the photonic component, the speed of production (i.e., units per hour (UPH)) and yield of the optoelectronic package structures can be increased.

Referring back to FIGS. 2A, 2B and 2C and FIGS. 3 to 5, in some alternative embodiments, the optoelectronic package structure may include a supportive structure 20 and a photonic component 21 disposed on the supportive structure 20. The photonic component 21 includes a portion 21*a*. The portion 21*a* of the photonic component 21 overhangs an edge 20*e* of the supportive structure 20. The portion 21*a* includes an optical portion 21*a*1. In some embodiments, the optical portion 21*a*1 may occupy the entire lower surface of the portion 21*a*. The optical portion 21*a*1 is located at the overhang portion 21*a* of the photonic component 21, so that the optical portion 21*a*1 also overhangs an edge 20*e* of the supportive structure 20. The supportive structure 20 has an extension portion 20*s* extending outwardly with respect to the edge 20*e* of the supportive structure 20, and a length D of the extension portion 20*s* is greater than an overhang distance L of the portion 21*a* (or an overhang distance of the optical portion 21*a*1).

In some embodiments, the extension portion 20*s* of the supportive structure 20 may be located at a periphery of the supportive structure 20. For example, in some embodiments, the supportive structure 20 may include an extension adjacent to the edge 20*e*1 and an extension adjacent to the edge 20*e*2 as illustrated in FIG. 2B or FIG. 3. In some embodiments, the supportive structure 20 may include an extension adjacent to the edge 20*e*1 as illustrated in FIG. 4 or FIG. 5.

The extension portion 20*s* and the edge 20*e* of the supportive structure 20 may define a recess. In some embodiments, the recess may have a shape of half-oval (FIG. 2B), rectangular (FIGS. 3 and 5), quarter-oval (FIG. 4) from a top view perspective. The recess may have other shapes from a top view perspective. The optical portion 21*a*1 of the photonic component 21 is located directly above the recess.

In some embodiments, the supportive structure 20 may be or include a carrier, an electronic component or a combination thereof. In some embodiments, the supportive structure 20 may be an electronic component or a carrier with an electronic component embedded therein; in such embodiments, the electronic components 22 showed in FIGS. 2A, 2B and 2C and FIGS. 3 to 5 may be omitted.

In some embodiments, the supportive structure 20 may include a carrier and an electronic component and the electronic component is located between the carrier and the photonic component. The embodiments will be discussed in detail below with reference to FIGS. 7A, 7B, 8A, 8B and 9. New reference numerals may be used in these drawings for clarity.

Figure 7A:
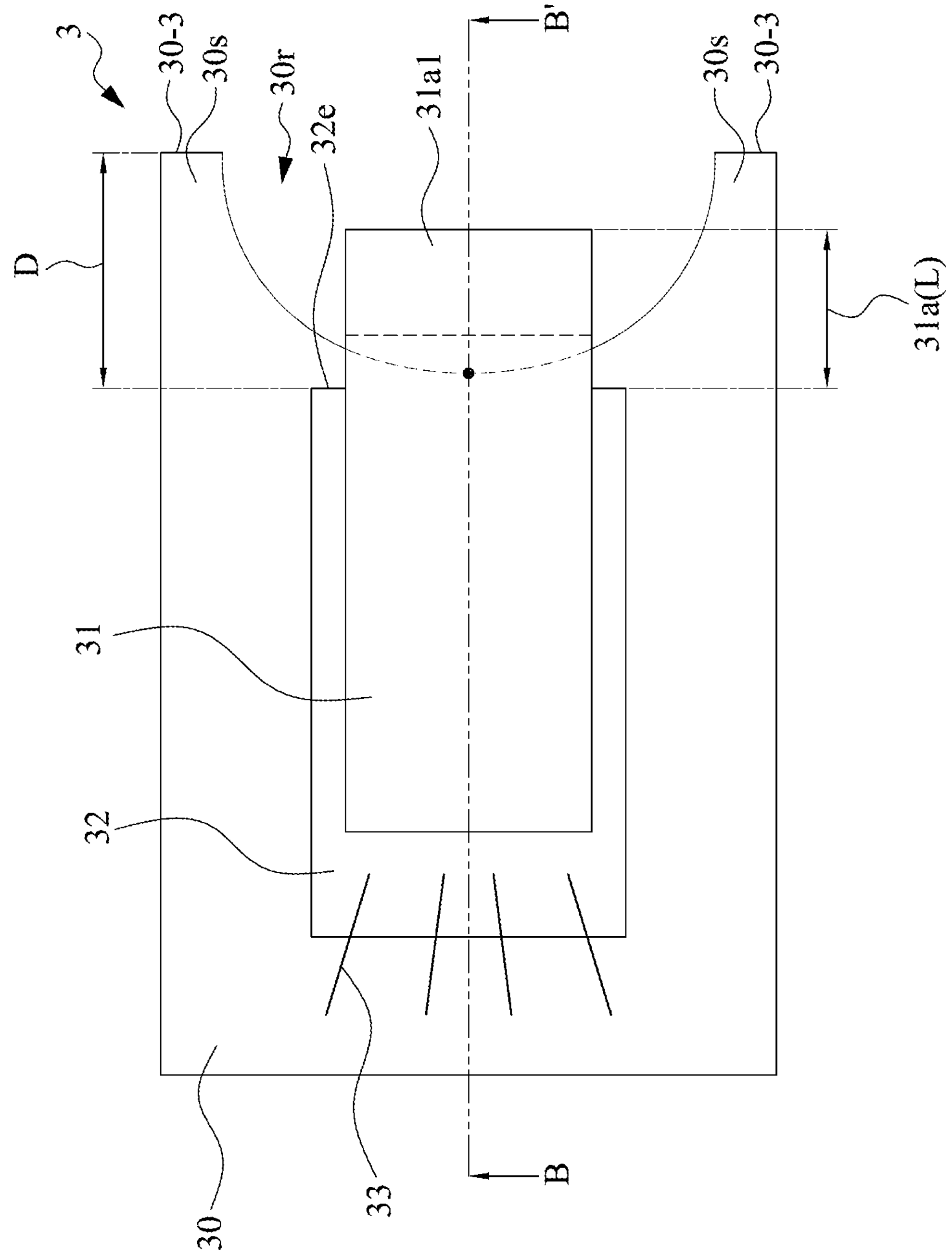
FIG. 7A illustrates a top view of an optoelectronic package structure in accordance with some embodiments of the present disclosure.
Figure 7B:
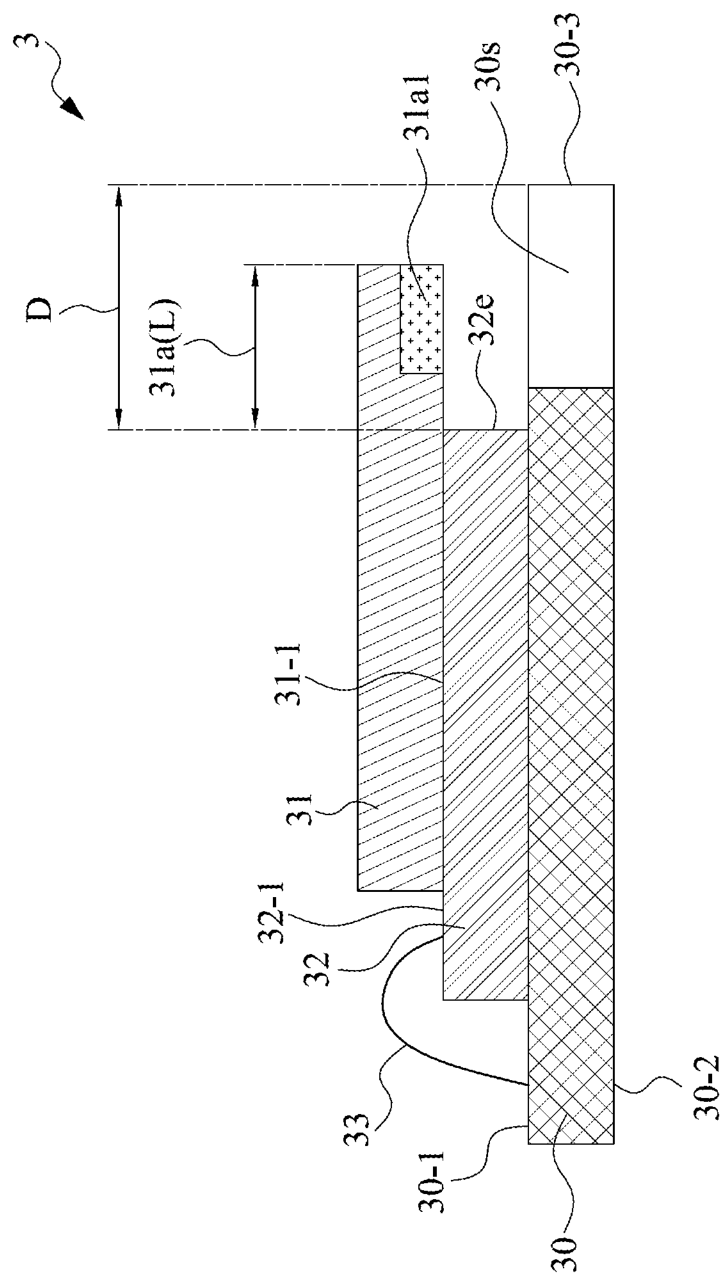
FIG. 7B illustrates a cross-sectional view of an optoelectronic package structure in accordance with some embodiments of the present disclosure.

FIG. 7A illustrates a top view of an optoelectronic package structure 3 in accordance with some embodiments of the present disclosure. FIG. 7B illustrates a cross-sectional view of an optoelectronic package structure 3 along line B-B' of FIG. 7A in accordance with some embodiments of the present disclosure.

As shown in FIGS. 7A and 7B, the optoelectronic package structure 3 includes a carrier 30, a photonic component 31, an electronic component 32, and bonding wires 33. The carrier 30 includes an upper surface 30-1, a lower surface 30-2 and a lateral surface 30-3. The carrier 30 includes a recessed portion 30*r* recessed from at least one lateral surface (e.g., lateral surface 30-3) of the carrier 30. The electronic component 32 is disposed on the carrier 30 and an upper surface 32-1 of the electronic component 32 faces away from the carrier 30. The upper surface 32-1 of the electronic component 32 is an active surface. The photonic component 31 is disposed over the carrier 30. In some embodiments, the photonic component 31 is disposed on the electronic component 32 and a lower surface 31-1 of the photonic component 31 faces the electronic component 32. The lower surface 31-1 of the photonic component 31 is an active surface. The photonic component 31 includes a portion 31*a* overhangs an edge 32*e* of the electronic component 32. The photonic component 31 further includes an optical portion 31*a*1. The optical portion 31*a*1 may occupy the entire lower surface of the portion 31*a*. The optical portion 31*a*1 is located at the overhang portion 31*a* of the photonic component 31, so that the optical portion 31*a*1 also overhangs an edge 32*e* of the electronic component 32. In some embodiments, the optical portion 31*a*1 may include one or more optical ports (not shown) exposed from the lower surface 31-1 of the portion 31*a*. In some embodiments, the one or more optical ports are configured to be coupled to an optical component, such as one or more optical fibers or one or more optical fiber array units (FAU). The carrier 30 has an extension portion 30*s* extending outwardly with respect to the edge 32*e* of the electronic component 32, and a length D of the extension portion 30*s* is greater than an overhang distance L of the portion 31*a* (or an overhang distance of the optical portion 31*a*1). In some embodiments, the optical portion 31*a*1 of the photonic component 31 overhangs the edge 32*e* of the electronic component 32, and a distance D between the edge 32*e* of the electronic component 32 and an adjacent edge (30-3) of the carrier 30 is greater than an overhang distance L of the portion 31*a* (or an overhang distance of the optical portion 31*a*1. In some embodiments, the optical portion 31*a*1 is within the recessed portion 30*r* from a top view perspective. The bonding wires contact the upper surface 32-1 of the edge 32*e* of the electronic component 32 and the upper surface 30-1 of the carrier so as to provide electrical connection there between. In some embodiments, the optoelectronic package structure 3 is similar to the optoelectronic package structure 2, while the optoelectronic package structure 3 includes the electronic component 32 between the carrier 30 and the photonic component 31.

Figure 8A:
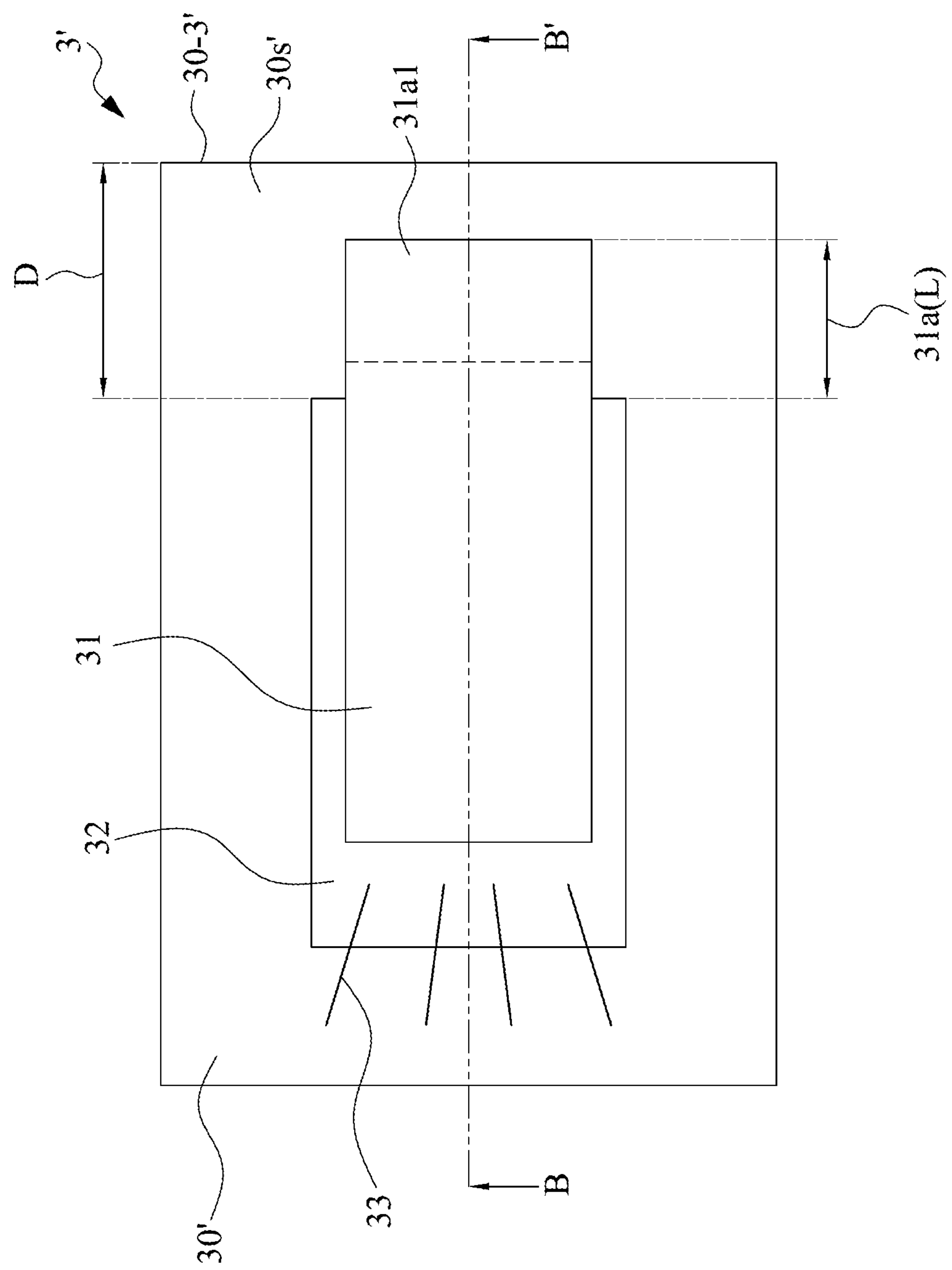
FIG. 8A illustrates a top view of an optoelectronic package structure in accordance with some embodiments of the present disclosure.
Figure 8B:
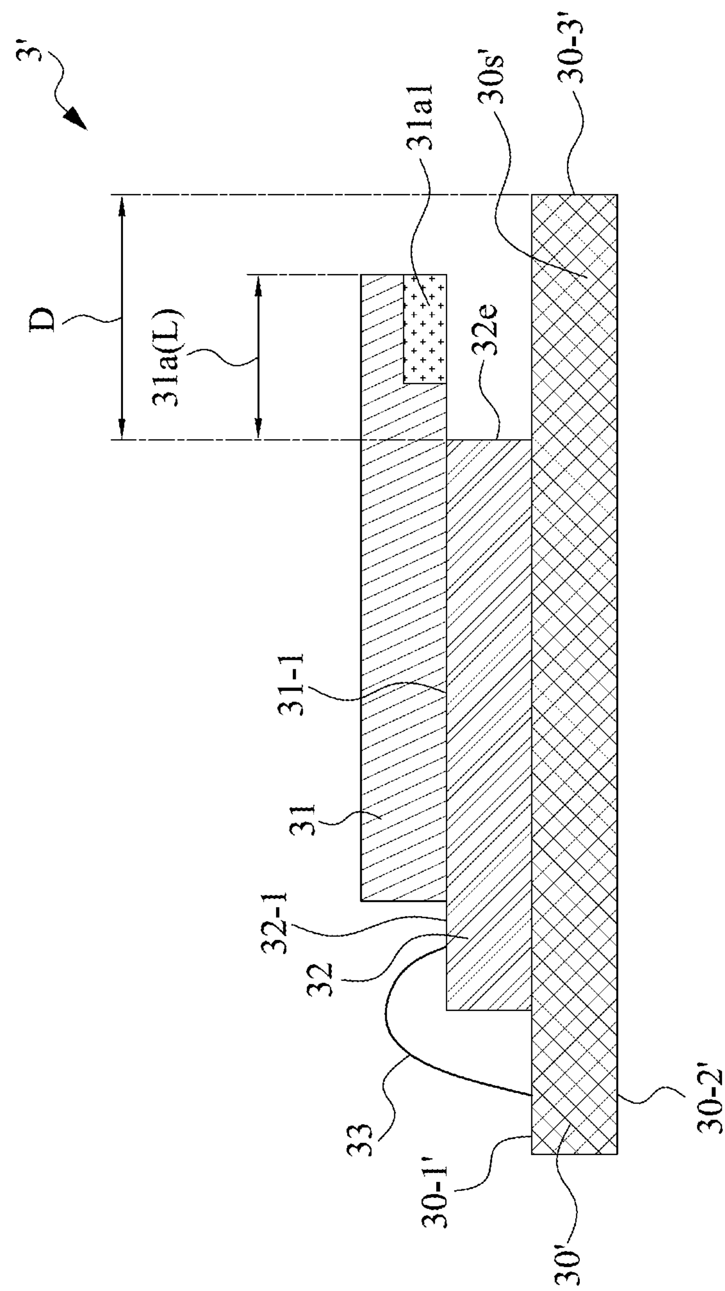
FIG. 8B illustrates a cross-sectional view of an optoelectronic package structure in accordance with some embodiments of the present disclosure.

FIG. 8A illustrates a top view of an optoelectronic package structure 3' in accordance with some embodiments of the present disclosure. FIG. 8B illustrates a cross-sectional view of an optoelectronic package structure 3' alone line B-B' in accordance with some embodiments of the present disclosure. The optoelectronic package structure 3' is similar to the optoelectronic package structure 3, except that the carrier 30' of the optoelectronic package structure 3' does not include a recessed portion recessed from the lateral surface. As shown in FIG. 8A, a projection of the optical portion 31*a*1 of the photonic component 31 is within a projection the carrier 30' from a top view perspective (i.e., in the vertical direction). As shown in FIG. 8B, the optical portion 31*a*1 of the photonic component 31 does not extend beyond the lateral surface 30'-3 from a cross-sectional view.

As the photonic component 31 is spaced apart from the carrier, the optical portion 31*a*1 of the photonic component 31 overhangs the edge 32*e* of the electronic component 32, and the photonic component 31 does not extend beyond the lateral surface 30'-3 from a cross-sectional view, the optical portion 31*a*1 can be protected from being damaged from a separation process or a singulation process (for example, when the optoelectronic package structure 3 or 3' is turned or flipped over with the use of the edge 30-3 or 30'-3 as a pivot. Consequently, each optoelectronic package structure 3 can be obtained through such a singulation process with no or less damage to the optical portion of the photonic component.

Figure 9:
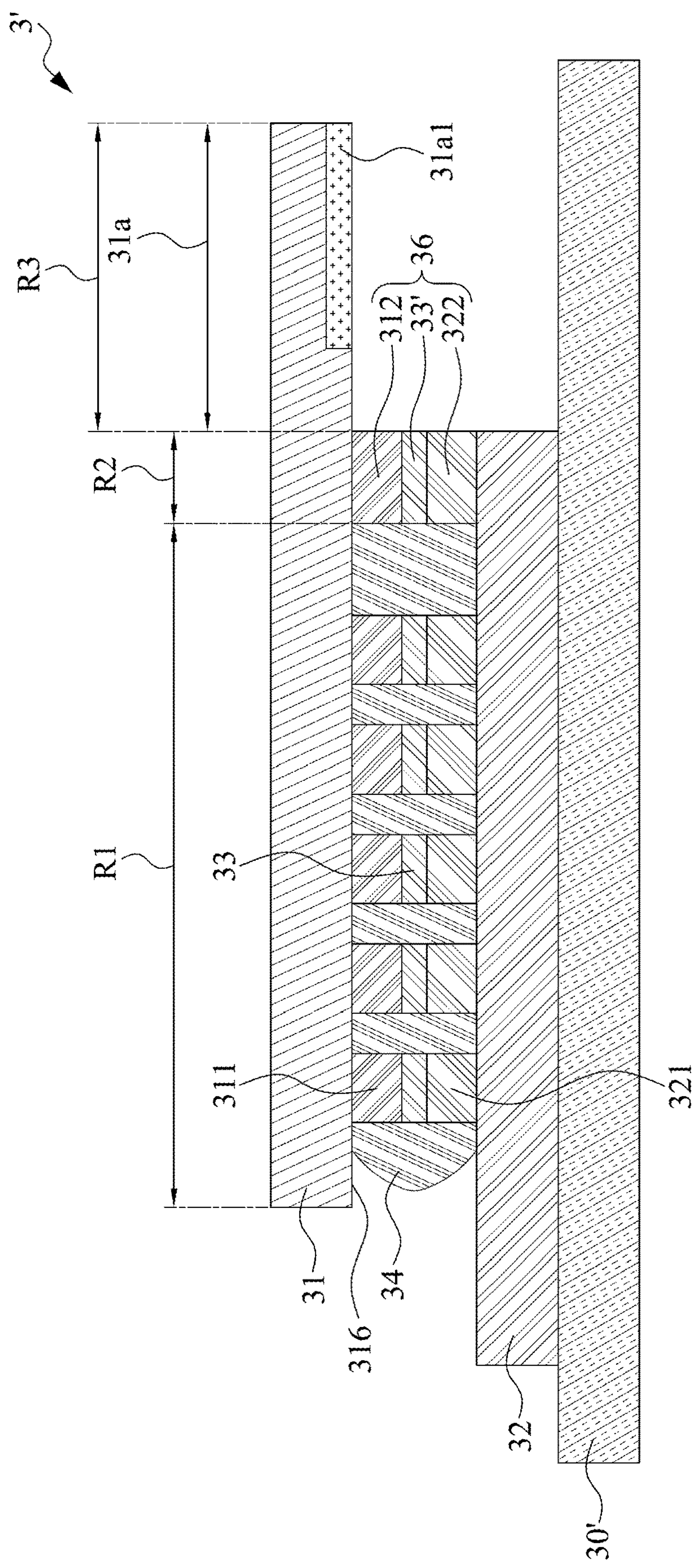
FIG. 9 illustrates a cross-sectional view of an optoelectronic package structure in accordance with some embodiments of the present disclosure.

FIG. 9 illustrates a cross-sectional view of an optoelectronic package structure 3' in accordance with some embodiments of the present disclosure. In FIG. 9, the structures between the photonic component 31 and the electronic component 32 are shown in more detail. As illustrated in FIG. 9, the optoelectronic package structure 3' further include a blocking structure 36. The blocking structure 36 may be located between the photonic component 31 and the electronic component 32. The blocking structure 36 may be located adjacent to the optical portion 31*a*1 of the photonic component 31.

In some embodiments, the photonic component 31 has a first region R1, a second region R2 and a third region R3. The second region R2 is located between the first region R1 and the third region R3. The first region R1 may be an electrical connection region R1 and is configured to electrically connect the electronic component 32 and the photonic component 31. The second region may be a blocking region R2 and is configured to block a filling material 34 disposed between the electronic component 32 and the photonic component 31. The third region R3 may include the portion 31*a* of the photonic component 31 which overhangs the electronic component 32. The portion 31*a* includes an optical portion 31*a*1 as discussed above.

The first region R1 may include a plurality of bonding pads or bumps 311. The electronic component 32 may include a plurality of bonding pads or bumps 321. The bonding pads or bumps 321 of the electronic component 32 and the bonding pads or bumps 311 of the photonic component 31 may form joint structures to provide electrical communication between the electronic component 32 and the photonic component 31. In some embodiments, the optoelectronic package structure 3' may further include a solder material 33' between the bonding pads or bumps 311 and the bonding pads or bumps 321.

The second region R2 may include a blocking structure 36. The second region R2 separates the third region R3 from the first region R1. Specifically, the third region R3 is separated from the first region R1 by the structure 36. The blocking structure 36 may function as a barrier wall and prevent the filling material 34, which is disposed between the electronic component 32 and photonic component 31 to fill between the joint structures of the bonding pads or bumps 311 and the bonding pads or bumps 321, from overflowing to the third region R3. The blocking structure 36 may have a shape of strip or any other suitable shape from a top view perspective. In some embodiments, although not shown in FIG. 9, an end of the blocking structure 36 may extend into the first region R1 along a periphery of the first region R1. The blocking structure 36 may be made of a polymeric material, metal or alloy, and so on.

In some embodiments, the blocking structure 36 may include metal or alloy. In some embodiments, the blocking structure 36 includes a blocking pad or bump 312 located at a lower surface of the photonic component 31 and a blocking pad or bump 322 located at an upper surface of the electronic component 32. The blocking pad or bump 312 and the blocking pad or bump 322 can form a joint structure at the same operation when forming the joint structures of the bonding pads or bumps 311 and the bonding pads or bumps 321. The joint structure is configured to function as a barrier wall to prevent a filling material 34 from entering the third region R3 of the photonic component 31. In some embodiments, a solder material 33' may be disposed between the blocking pad or bump 312 and the blocking pad or bump 322.

A material for forming the bonding pads or bumps 311, the bonding pads or bumps 321, the blocking pad or bump 312, and the blocking pad or bump 322 may be the same or different and may include metal or alloy, such as copper (Cu), aluminum (Al), iron (Fe), zinc (Zn), nickel (Ni), tin (Sn), lead (Pb), silver (Ag), mercury (Hg), gold (Au), a combination thereof, or an alloy thereof. The filling material 34 may be, for example, an underfill, but is not limited thereto. The underfill may include an epoxy resin, polyimide, a phenolic compound or material, a material including a silicone dispersed therein, or a combination thereof.

Referring back to FIGS. 2A, 2B and 2C and FIGS. 3 to 5, in some alternative embodiments, the optoelectronic package structure may include a supportive structure 20 and a photonic component 21 disposed on the supportive structure 20. The photonic component 21 includes a portion 21*a*. The portion 21*a* of the photonic component 21 extends beyond an edge 20*e* of the supportive structure 20. The portion 21*a* includes an optical portion 21*a*1. In some embodiments, the optical portion 21*a*1 may occupy the entire lower surface of the portion 21*a*. The optical portion 21*a*1 may extends beyond an edge 20*e* of the supportive structure 20.

The supportive structure 20 defines a shaped region 20*s* adjacent to the edge 20*e*. The shaped region 20*s* is configured to protect the optical portion 21*a*1 of the photonic component 21 when turning the optoelectronic package structure. In some embodiments, a distance D between the edge 20*e* of the supportive structure 20 to a distal end (e.g., 20-3) of the shaped region 20*s* is greater than a length L of the portion 21*a* extending from the first edge 20*e* of the supportive structure 20 (or a length of the optical portion 21*a*1 extending from the first edge 20*e* of the supportive structure 20).

With the presence of the shaped region 20*s*, during a separation process or a singulation process, the optoelectronic package structure can be turned or flipped over with the use of the shaped region 20*s* (or a distal end of the shaped region 20*s*) as a pivot. In some embodiments, the shaped region is a sacrifice region. Though the shaped region 20*s* may be damaged and have cracks after the turning or flipping operation, the shaped region 20*s* may function as a sacrifice region and protect the optical portion 21*a*1 of the photonic component 21 from damage.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±50, less than or equal to ±4.5, less than or equal to ±3%, less than or equal to ±2%, less than or equal to ±10%, less than or equal to ±0.500, less than or equal to ±0.10%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optoelectronic package structure, comprising:

a supportive structure; and a photonic component disposed on the supportive structure, wherein the photonic component comprises an optical portion and the optical portion of the photonic component overhangs an edge of the supportive structure, wherein the supportive structure has an extension portion extending outwardly with respect to the edge of the supportive structure, and a length of the extension portion is greater than an overhang distance of the optical portion, and wherein the supportive structure comprises a carrier and an electronic component, and the electronic component is located between the carrier and the photonic component in the case that the supportive structure comprises the carrier and the electronic component.

2. The optoelectronic package structure of claim 1, wherein the extension portion of the supportive structure is located at a periphery of the supportive structure.

3. The optoelectronic package structure of claim 1, wherein the optical portion of the photonic component overhangs an edge of the electronic component, and a distance between the edge of the electronic component and an adjacent edge of the carrier is greater than the overhang distance of the optical portion.

4. The optoelectronic package structure of claim 3, wherein an active side of the photonic component faces an active side of the electronic component.

5. The optoelectronic package structure of claim 3, wherein the extension portion of the supportive structure is located at the carrier.

6. The optoelectronic package structure of claim 5, wherein the optical portion of the photonic component comprises at least one optical ports and the at least one optical ports face the carrier.

7. The optoelectronic package structure of claim 5, further comprising a blocking structure located between the photonic component and the electronic component and adjacent to the optical portion of the photonic component.

8. An optoelectronic package structure, comprising:

a supportive structure; and a photonic component disposed on the supportive structure and comprising an optical portion extending beyond a first edge of the supportive structure, wherein the supportive structure defines a shaped region adjacent to the first edge and the shaped region is configured to protect the optical portion of the photonic component when turning the optoelectronic package structure, and wherein the supportive structure comprises cracks at the shaped region.

9. The optoelectronic package structure of claim 8, wherein the shaped region acts as a pivot when turning the optoelectronic package structure.

10. The optoelectronic package structure of claim 8, wherein a distance between the first edge of the supportive structure to a distal end of the shaped region is greater than a length of the optical portion extending beyond the first edge of the supportive structure.

11. The optoelectronic package structure of claim 8, wherein the shaped region is a sacrifice region.

12. The optoelectronic package structure of claim 8, further comprising one or more electronic components disposed on the supportive structure, wherein the one or more electronic components are spaced apart from the photonic component via a blocking structure.

13. The optoelectronic package structure of claim 12, wherein the blocking structure surrounds the photonic component.

* * * * *